United States Patent
Park et al.

(10) Patent No.: US 8,242,007 B2
(45) Date of Patent: Aug. 14, 2012

(54) SEMICONDUCTOR DEVICE FORMED USING SINGLE POLYSILICON PROCESS AND METHOD OF FABRICATING THE SAME

(75) Inventors: Jong-ho Park, Incheon (KR); Chang-ki Jeon, Gimpo-si (KR); Hyi-jeong Park, Seoul (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 581 days.

(21) Appl. No.: 12/401,693

(22) Filed: Mar. 11, 2009

(65) Prior Publication Data

US 2009/0230481 A1    Sep. 17, 2009

(30) Foreign Application Priority Data

Mar. 13, 2008 (KR) .................. 10-2008-0023480

(51) Int. Cl.
*H01L 27/06* (2006.01)
*H01L 21/60* (2006.01)

(52) U.S. Cl. ........ 438/586; 438/115; 438/207; 438/266; 438/309; 438/591; 257/378; 257/E21.158; 257/E21.506; 257/E21.532; 257/E27.015

(58) Field of Classification Search .............. 438/115, 438/199–208, 234–239, 286, 309, 369, 399, 438/542–555; 257/151–153, 249, 262, 314–320, 257/331, 366, 368–401, 412, 486, 619, 751, 257/767, E21.382–E21.385, E21.634, E21.695, 257/E21.696, E27.015, E27.017, E27.03–E27.032, 257/E27.108, E27.109, E27.061, E27.062, 257/E29.028, E29.067, E29.125–E29.131, 257/E29.134–E29.138, E29.14–E29.161, 257/E29.194–E29.225, E29.114, E29.115, 257/E29.124, E29.255–E29.313, E29.315, 257/E29.316, E29.319

See application file for complete search history.

(56) References Cited

U.S. PATENT DOCUMENTS 5,342,794 A * 8/1994 Wei ............................ 438/374

* cited by examiner

*Primary Examiner* — Julio J Maldonado
*Assistant Examiner* — Walter H Swanson
(74) *Attorney, Agent, or Firm* — Hiscock & Barclay, LLP

(57) ABSTRACT

Provided are a semiconductor device including a source/drain and a gate formed using a doped polysilicon process, and a method of fabricating the semiconductor device. The method comprises: forming a gate insulating layer on a part of an active region on a first conductivity type epitaxial layer; forming a conductive layer on the epitaxial layer; implanting high concentration impurities of a second conductivity type a first portion of the conductive layer on the gate insulating layer and second portions of the conductive layer on both sides of the first insulating layer; patterning the conductive layer; forming a second insulating layer on the epitaxial layer and high concentration impurity regions of the second conductivity type below the second conductive pattern; and implanting low-concentration impurities of the second conductivity type into the epitaxial layer between a gate structure and the high concentration impurity regions.

8 Claims, 19 Drawing Sheets

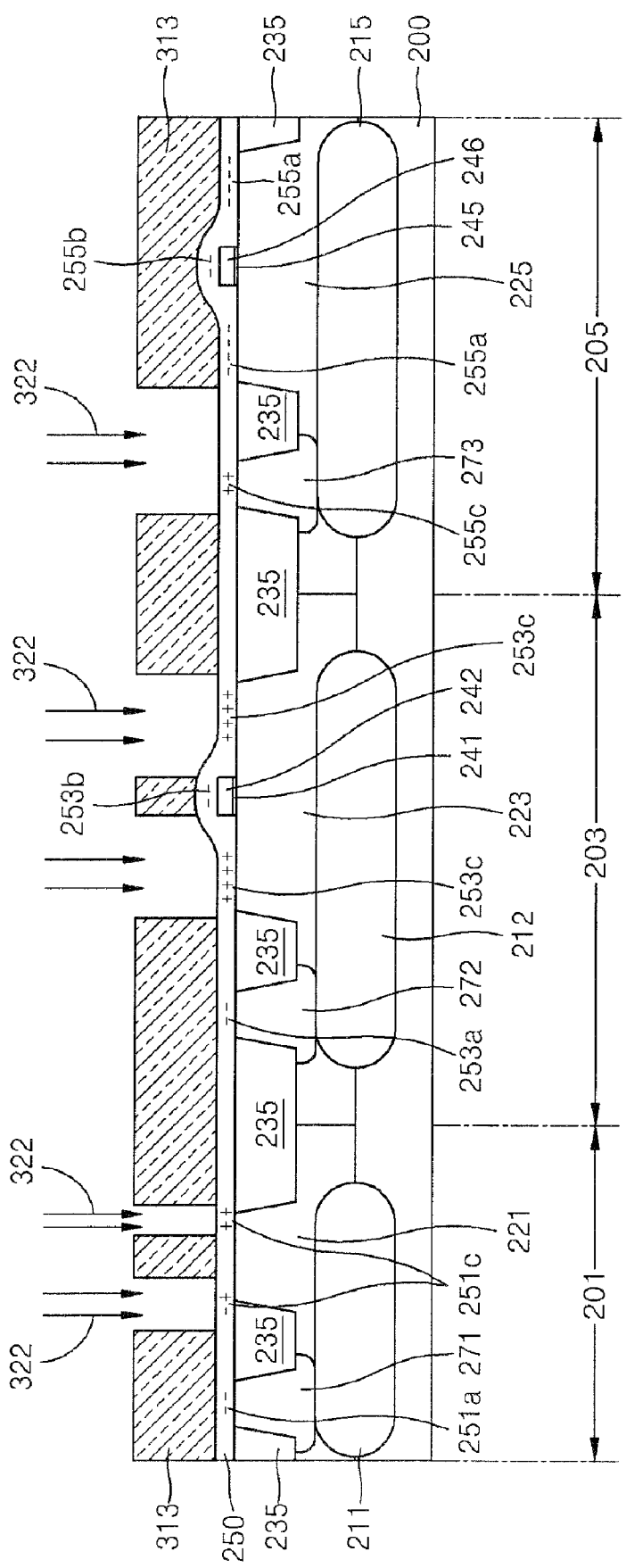

SEMICONDUCTOR DEVICE FORMED USING SINGLE POLYSILICON PROCESS AND METHOD OF FABRICATING THE SAME

CROSS-REFERENCE TO RELATED PATENT APPLICATIONS

This application claims the benefit of Korean Patent Application No. 10-2008-0023480, filed on Mar. 13, 2008, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a bipolar-complementary metal oxide semiconductor (Bi-CMOS) transistor, in which a source/drain and a gate are formed using a single polysilicon process, and a method of fabricating the Bi-CMOS transistor.

2. Description of the Related Art

Bi-CMOS transistors are being actively researched in order to realize high operational speed, high integrity, and low power consumption. A Bi-CMOS transistor includes a bipolar transistor that can operate at high speed and a CMOS transistor that is highly integrated and has low power consumption.

In order to realize a high frequency bipolar process, a double polysilicon process is generally used. However, in a case where the Bi-CMOS transistor is fabricated using the double polysilicon process, an additional mask process is required to fabricate the high voltage CMOS transistor. In addition, since the high voltage CMOS transistor requires an extended drain, it is difficult to fabricate the CMOS transistor.

SUMMARY OF THE INVENTION

The present invention provides a semiconductor device in which a source/drain and a gate are formed using a doped polysilicon process, and a method of fabricating the semiconductor device.

According to an aspect of the present invention, there is provided a method of fabricating a semiconductor device using a single polysilicon process. First, a first insulating layer is formed on a portion of an active region of a first conductivity type epitaxial layer. A conductive layer is formed on the epitaxial layer and the first insulating layer. High concentration impurities of a second conductivity type are implanted into a first portion of the conductive layer over the first insulating layer and second portions of the conductive layer, which are disposed in both sides of the first insulating layer, and high concentration impurities of the first conductivity type are implanted into a third portion of the conductive layer, which is spaced from one of the second portions. The conductive layer is patterned to form gate structure, which comprises the first insulating layer and a gate including the first portion disposed on the first insulating layer, and to form first conductive layer patterns that are spaced from the gate structure and including the second portions in both sides of the gate structure, and to form a second conductive layer pattern including the third portion, which is spaced from one of the first conductive layer patterns, on the epitaxial layer. A second insulating layer is formed on the epitaxial layer including the gate structure and the first and second conductive layer patterns. At this time, high concentration first impurity regions of the second conductivity type are formed to be spaced from the gate structure on the epitaxial layer, below the first conductive layer patterns, and a high concentration second impurity region of the first conductivity type is formed on the epitaxial layer, below the second conductive layer pattern. Low-concentration impurities of the second conductivity type are implanted into the epitaxial layer between the gate structure and the highly concentrated first impurity regions to form low concentration third impurity regions of the second conductivity type.

According to another aspect of the present invention, there is provided a method of fabricating a semiconductor device using a single polysilicon process. First, a epitaxial layer including a first active region on which a bipolar transistor will be formed, a second active region on which a first metal oxide semiconductor (MOS) transistor will be formed, and a third active region on which a second MOS transistor will be formed, is prepared. A first gate insulating layer and a second gate insulating layer are formed on the second and third active regions of the epitaxial layer, respectively. A first conductive layer is formed on an entire surface of the epitaxial layer. High concentration impurities of a second conductivity type are implanted into a first portion in the first active region, a second portion over the first gate insulating layer and a first portion spaced from the second portion in the second active region, and a second portion over the second gate insulating layer and first portions in both sides of the second portion in the third active region. High concentration impurities of a first conductivity type are implanted into second portions spaced from the first portion of the first active region, third portions in both sides of the second portion in the second active region, and a third portion spaced from one of the first portion in the third active region. The first conductive layer is patterned to form first conductive patterns respectively including the first and second portions in the first active region, to form a first gate structure having the first gate insulating layer and a first gate including the second portion and second conductive patterns respectively including the first and second portion in the second active region, and to form a second gate structure having the second gate insulating layer and a second gate including the second portion, and third conductive patterns including first and second portion in the third active region. A first insulating layer is formed on the entire upper surface of the epitaxial layer. At this time, a first impurity region and second impurity regions is formed below the first conductive patterns in the first active region, first impurity regions and a second impurity region are formed below the second conductive patterns in the second active region, and a first impurity region and second impurity regions are formed below the third conductive patterns in the third active region. Low-concentration impurities of the first conductivity type are implanted into the first and second active regions to form a third impurity region connecting the second impurity regions to each other in the first active region and to form third impurity regions between the first gate structure and the first impurity regions in the second active region. Low-concentration impurities of second conductivity type are implanted into the third active region to form third impurity regions between the second gate structure and the second impurity regions in the third active region. A second insulating layer is formed on the entire upper surface of the epitaxial layer. The first and second insulating layers are etched to form spacers on side walls of the first and second gate structures and the conductive patterns. A second conductive layer is formed on the entire upper surface of the epitaxial layer. High concentration impurities of second conductivity type are implanted into a portion of the conductive layer to form a fourth impurity region in the third impurity region of the first active region, which corresponds to the third impurity region of the first active region.

BRIEF DESCRIPTION OF THE DRAWINGS

The above and other features and advantages of the present invention will become more apparent by describing in detail exemplary embodiments thereof with reference to the attached drawings in which:

FIGS. 2A through 2M are cross-sectional views for describing a method of fabricating a Bi-CMOS transistor using a single polysilicon process, according to another embodiment of the present invention.

DETAILED DESCRIPTION OF THE INVENTION

Figure 1A:
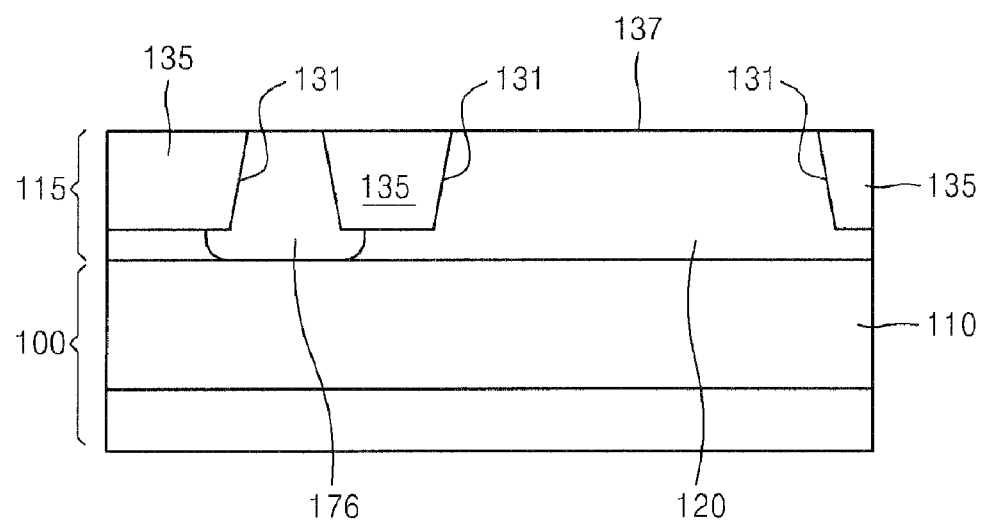
FIGS. 1A through 1J are cross-sectional views for describing a method of fabricating a metal oxide semiconductor (MOS) transistor using a single polysilicon process, according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one skilled in the art. In the drawings, the thicknesses of layers and regions are exaggerated for clarity. Like reference numerals in the drawings denote like elements, and thus their description will be omitted.

FIGS. 1A through 1J are cross-sectional views for describing a method of fabricating an NMOS transistor according to an embodiment of the present invention. Referring to FIG. 1A, a semiconductor substrate 100 of a first conductivity type, P type for example, is prepared to form a P+ type buried layer 110 in the semiconductor substrate 100. An epitaxial layer 115 is formed on the semiconductor substrate 100. Then, first conductivity type impurity ions with a low concentration, for example P− impurity ions, are implanted into the epitaxial layer to form a P− type well 120. Device isolation regions 135 which define an active region 137, are formed in trenches 131. The device isolation regions 135 can be formed to have a shallow trench isolation (STI) structure or a local oxidation of silicon (LOCOS) structure. A P+ type sink region 176 is formed in the P− type well 120 between two device isolation regions 135 so as to contact the P+ type buried layer 110.

Figure 1B:
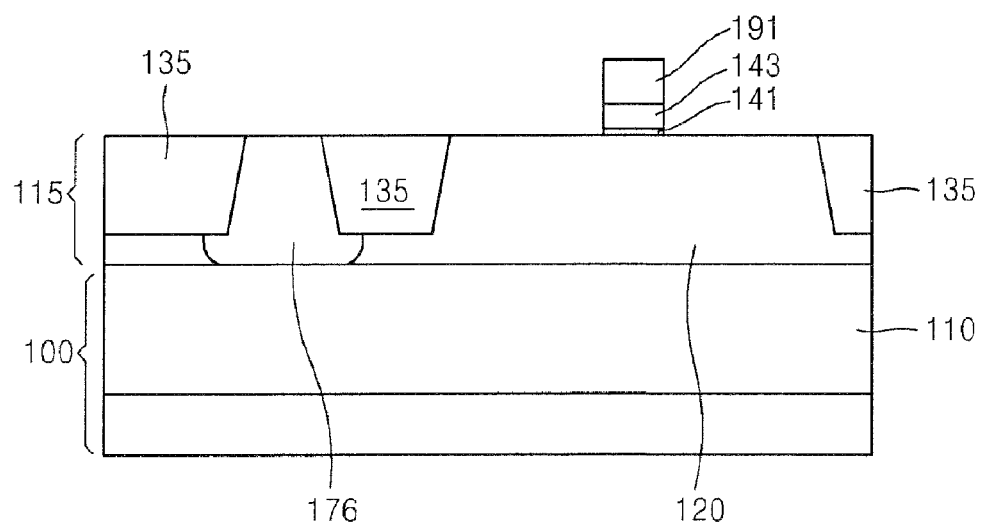

Referring to FIG. 1B, a thin first blanket insulating layer (not shown) is formed on the semiconductor substrate 100. The first blanket insulating layer can include, for example, a thermal oxide layer or a chemical vapor deposition (CVD) oxide layer. A first photosensitive layer 191 is formed on the first blanket insulating layer. The first blanket insulating layer is etched using the first photosensitive layer 191 to form a gate insulating layer 141. After forming the first blanket insulating layer, a channel injection region (not shown) may be further formed by implanting P type impurity ions into the P− type well 120. In order to prevent the gate insulating layer 141 from being contaminated by impurities in post processes, a blanket protective layer (not shown) may be formed on the first blanket insulating layer for protecting the gate insulating layer 141. The blanket protective layer can include a conductive layer, for example, a polysilicon layer. The blanket protective layer is etched together with the first insulating layer using the first photosensitive layer 191 as a mask to form the protective layer 143.

Figure 1C:
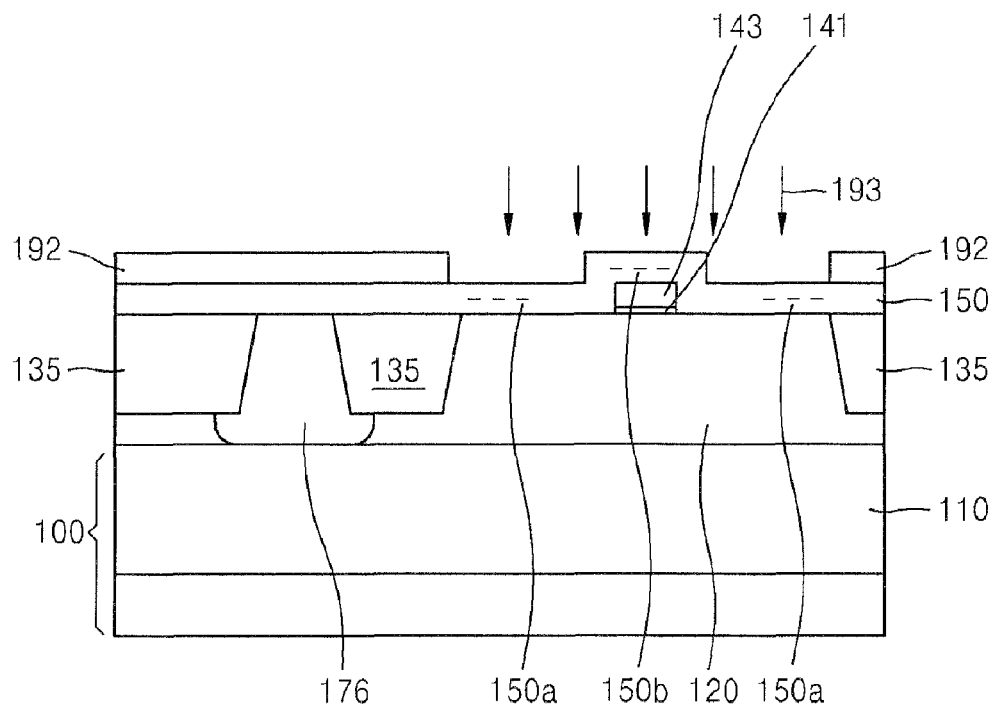

Referring to FIG. 1C, a polysilicon layer 150 is formed on the semiconductor substrate 100 including the gate insulating layer 141 and the protective layer 143. A second photosensitive layer 192 is formed on the polysilicon layer 150 so as to expose a first part 150b over the gate insulating layer 141 and second parts 150a on both sides of the gate insulating layer 141, on which source/drain regions will be formed. Then, high concentration N+ type impurity ions 193 are implanted into the first part 150b and the second parts 150a of the polysilicon layer 150 using the second photosensitive layer 192 as a mask.

Figure 1D:
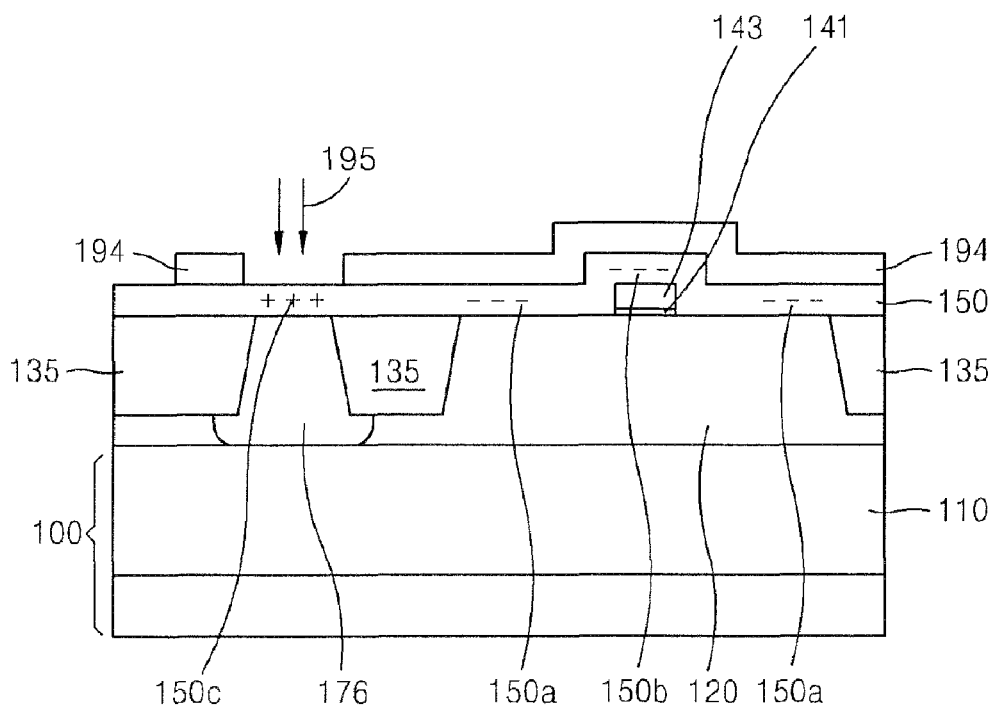

Referring to FIG. 1D, the second photosensitive layer 192 is removed. A third photosensitive layer 194 is formed on the polysilicon layer 150 so as to expose a third part 150c of the polysilicon layer 150, which is over the sink region 176. High concentration P+ type impurity ions are implanted into the exposed third part 150c of the polysilicon layer 150 using the third photosensitive layer 194 as a mask.

Figure 1E:
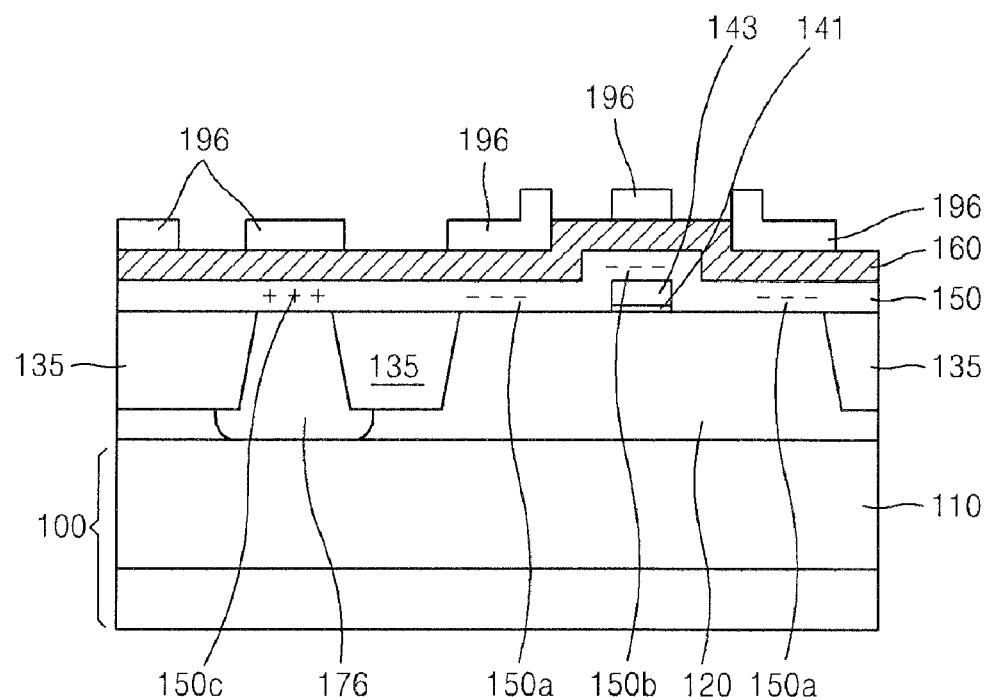

Referring to FIG. 1E, the third photosensitive layer 194 is removed. Then, an insulating layer 160, which may include an oxide layer, is deposited on the polysilicon layer 150. A fourth photosensitive layer 196 is formed on the insulating layer 160. The fourth photosensitive layer 196 covers the first part 150b and the second parts 150a of the polysilicon layer 150 in which the N+ type impurity ions 193 were implanted, and also covers the third part 150c of the polysilicon layer 150 in which the P+ type impurity ions 195 were implanted.

Figure 1F:
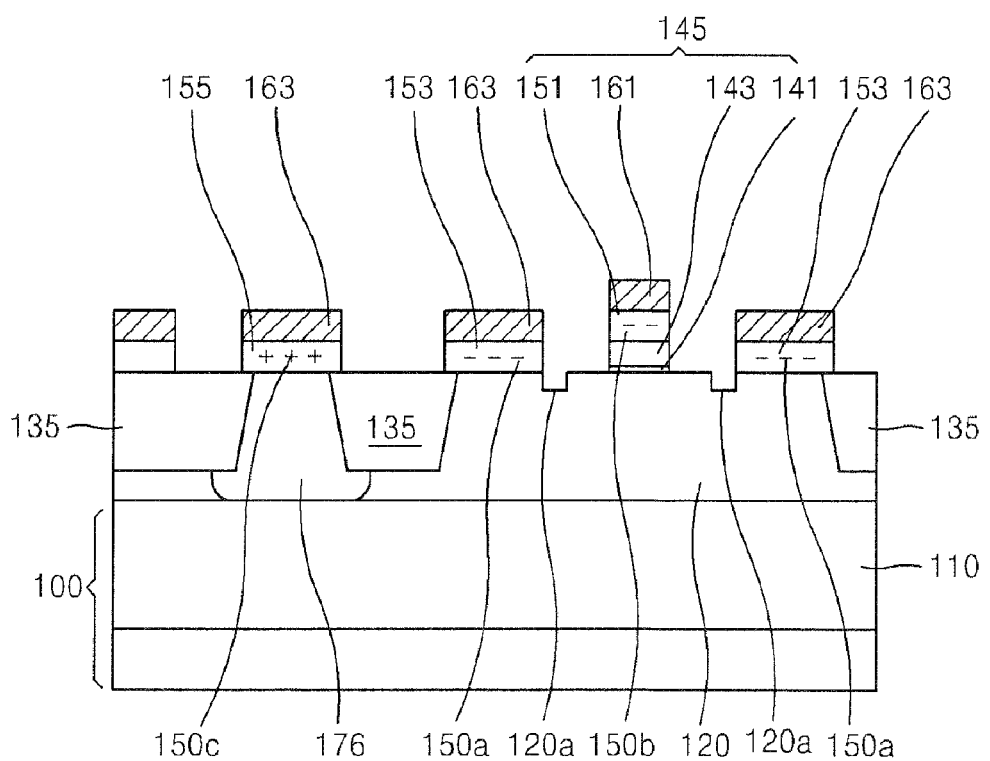

Referring to FIG. 1F, the insulating layer 160 and the polysilicon layer 150 are etched using the fourth photosensitive layer 196 to form a gate structure 145, which includes the gate insulating layer 141, the protective layer 143 formed on the gate insulating layer 141, a gate electrode 151 including a first part 150b formed on the protective layer 143, and a capping layer 161 formed on the gate electrode 151. In addition, first polysilicon patterns 153 including the second parts 150a are formed on the semiconductor substrate 100 on both sides of the gate structure 145, so as to be spaced from the gate structure 145, and a second polysilicon pattern 155 including the third part 150c, is formed on the semiconductor substrate 100 over the sink region 176. Insulating layer patterns 163 are arranged on the first polysilicon patterns 153 and the second polysilicon pattern 155. In addition, some parts of the P− type well 120 between the gate structure 145 and the first polysilicon patterns 153, are over-etched, and thus trenches 120a are formed which are adjacent to the first polysilicon patterns 153. In patterning the polysilicon layer, distances between the first polysilicon patterns 153 and the first gate structure 145 may be adjusted to control the breakdown voltages of the respective devices.

Figure 1G:
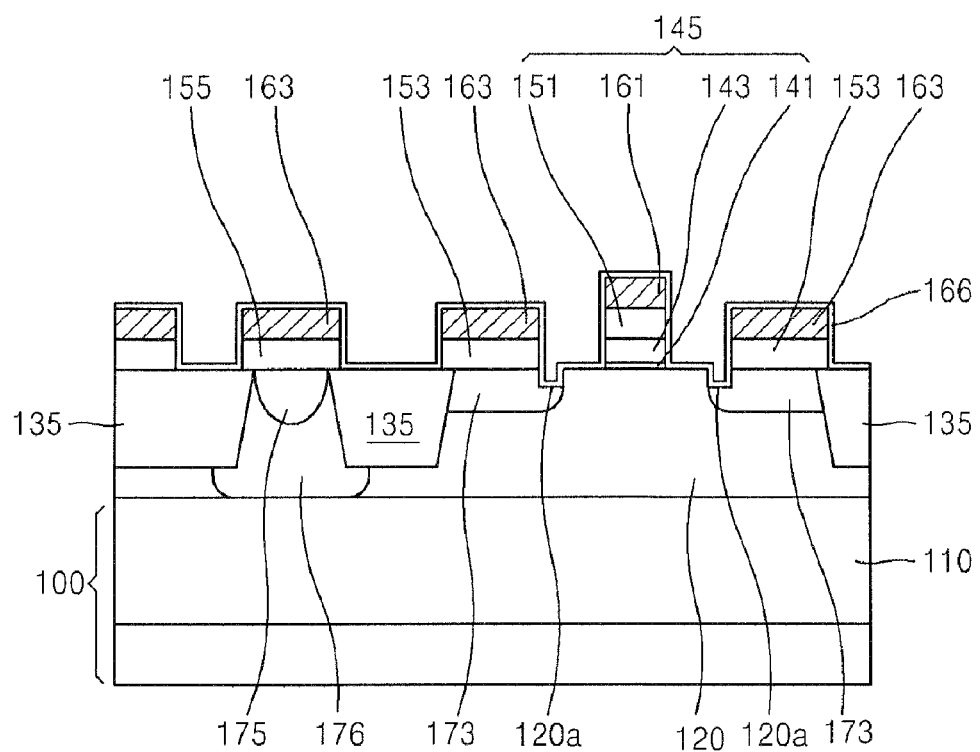

Referring to FIG. 1G, a thin third insulating layer 166 is formed, and a diffusion process is performed. Thus, a P+ type diffusion region 175 is formed in the P+ type sink region 176, and high concentration N+ type source/drain regions 173 are formed in the P− type well 120 on both sides of the gate structure 145. The high concentration N+ type source/drain regions 173 are separated from the P+ type diffusion region 175 by the device isolation layer 135.

Figure 1H:
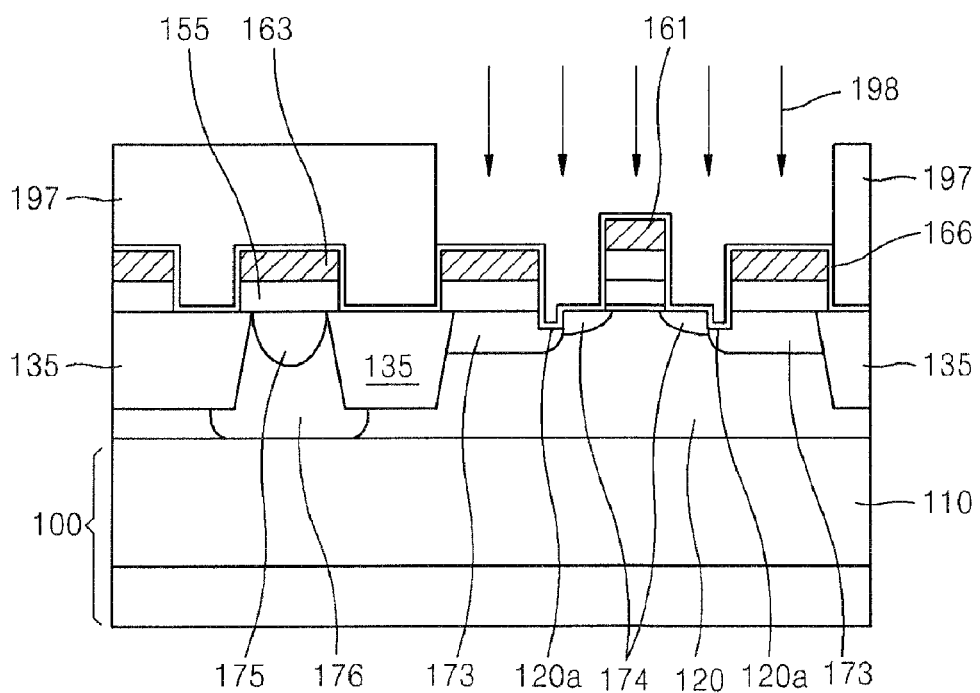

Referring to FIG. 1H, a fourth photosensitive layer 197 is formed on the third insulating layer 166 so as to expose the third insulating layer 166 between the gate structure 145 and the high concentration N+ type source/drain regions 173. Then, low concentration N− type impurity ions 198 are implanted into the P-type well 120 using the fourth photosensitive layer 197, capping layer 161, and insulating layer patterns 163 as masks to form low concentration N-type source/drain regions 174 between the high concentration N+ type source/drain regions 173 and the gate structure 145. The high concentration N+ type source/drain regions 173 respectively contact bottom surfaces and side surfaces of the trenches 120a, and the low concentration N-type source/drain regions 174 contact the high concentration source/drain regions 173. In the diffusion process for forming the low concentration N-type source/drain regions 174, a thermal oxide layer (not shown) may be further formed on the third insulating layer 166.

Figure 1I:
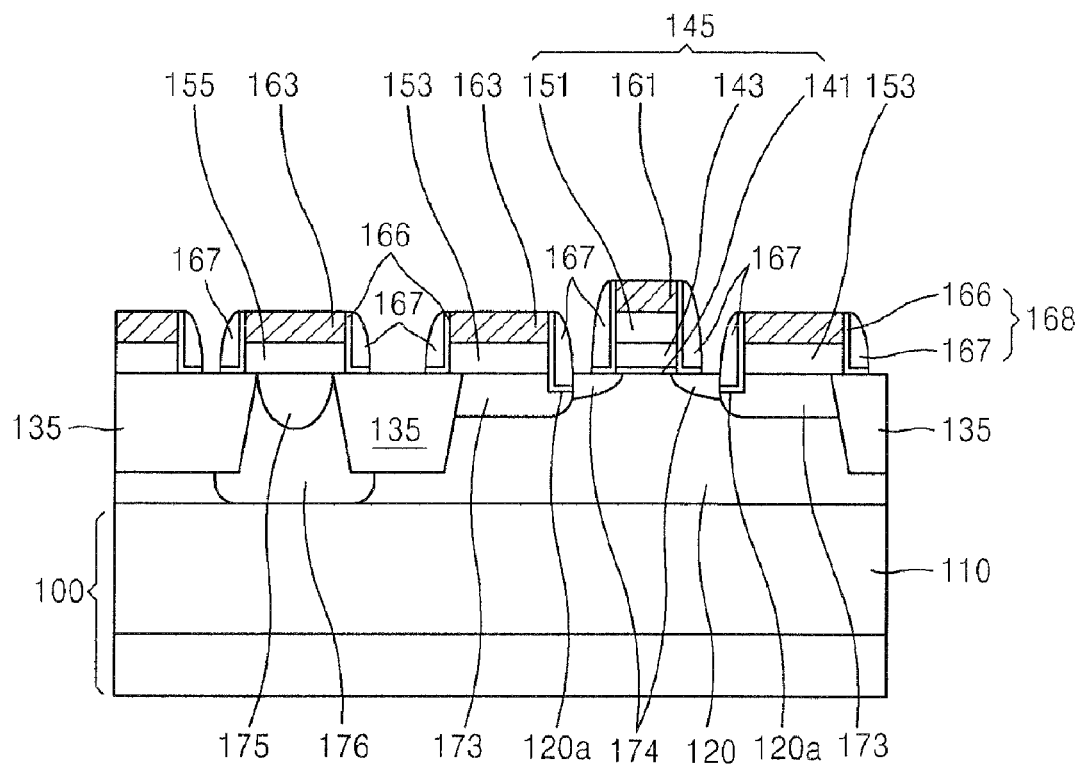

Referring to FIG. 1I, the fourth photosensitive layer 197 is removed. A fourth insulating layer 167, for example, a nitride layer, is deposited on the third insulating layer 166, and then, an etch-back process is performed to form spacers 168 on both walls of the gate structure 145. The spacers 168 each include the third insulating layer 166 and the fourth insulating layer 167. The spacers 168 are also formed on both sidewalls of the first and second polysilicon patterns 153 and 155 and the insulating layer patterns 163. The spacers 168 formed on the side-walls of the first polysilicon patterns 153, which contact the trenches 120a, are also formed on inner side walls of the trenches 120a.

Figure 1J:
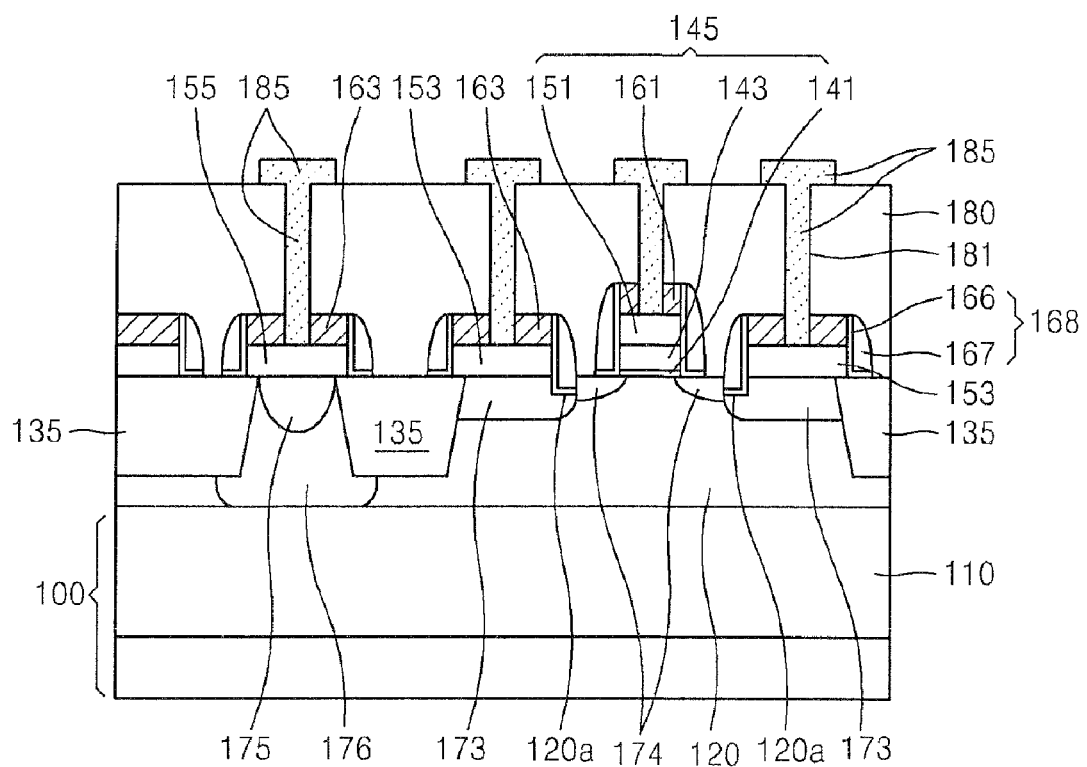

Referring to FIG. 1J, an interlayer dielectric layer 180 is formed on the entire surface of the semiconductor substrate 100. The interlayer dielectric layer 180, the insulating layer patterns 163, and the gate capping insulating layer 161 are etched to form contact holes 181 that expose the first and second polysilicon patterns 153 and 155 and the gate electrode 151. Metal 185 is formed in the contact holes 181 to connect to the exposed first and second polysilicon patterns 153 and 155 and the gate electrode 151.

Figure 2A:
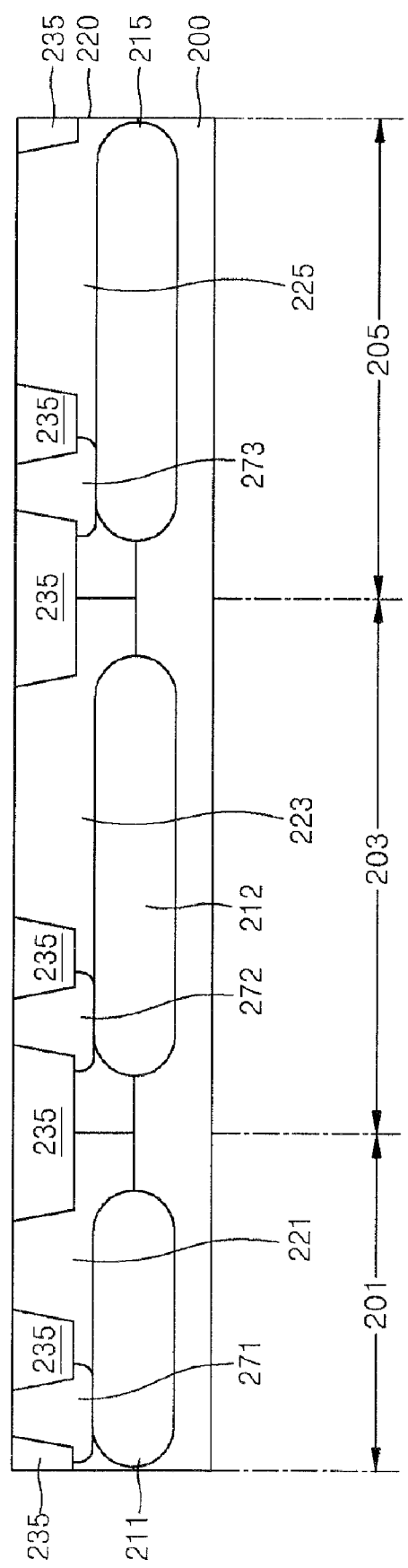

FIGS. 2A through 2M are cross-sectional views for illustrating a method of fabricating a Bi-CMOS transistor according to another embodiment of the present invention. Referring to FIG. 2A, a first conductivity type, for example, a P type semiconductor substrate 200 is prepared. The P type semiconductor substrate 200 includes a first region 201, on which an NPN bipolar transistor is formed, a second region 203, on which a PMOS transistor is formed, and a third region 205, on which an NMOS transistor is formed. A second conductivity type, for example, two N+ type first buried layers 211 and 212 are formed in the upper portion of the P type semiconductor substrate 200, in the first and second regions 201 and 203. In addition, a second buried layer of a first conductivity type, for example P+, is formed in the upper portion of the p-type semiconductor substrate 200 in the third region 205.

An epitaxial layer 220 is formed on the semiconductor substrate 200. The N type first well 221 is formed in the epitaxial layer 220 in the first region 201, the N type second well 223 is formed in the epitaxial layer 220 in the second region 203, and the P type third well 225 is formed in the epitaxial layer 220 in the third region 205.

Device isolation regions 235, defining active regions, are formed in the epitaxial layer 220. The device isolation regions 235 can be formed to have an STI structure or a LOCOS structure. An N+ type first sink region 271 is formed in the first well 221, between the two left device isolation regions 235 in the first region 201, an N+ type second sink region 272 is formed in the second well 223, between the two left device isolation regions 235 in the second region 203, and a P+ type third sink region 273 is formed in the third well 225, between the two left device isolation regions 235 in the third region 205.

Figure 2B:
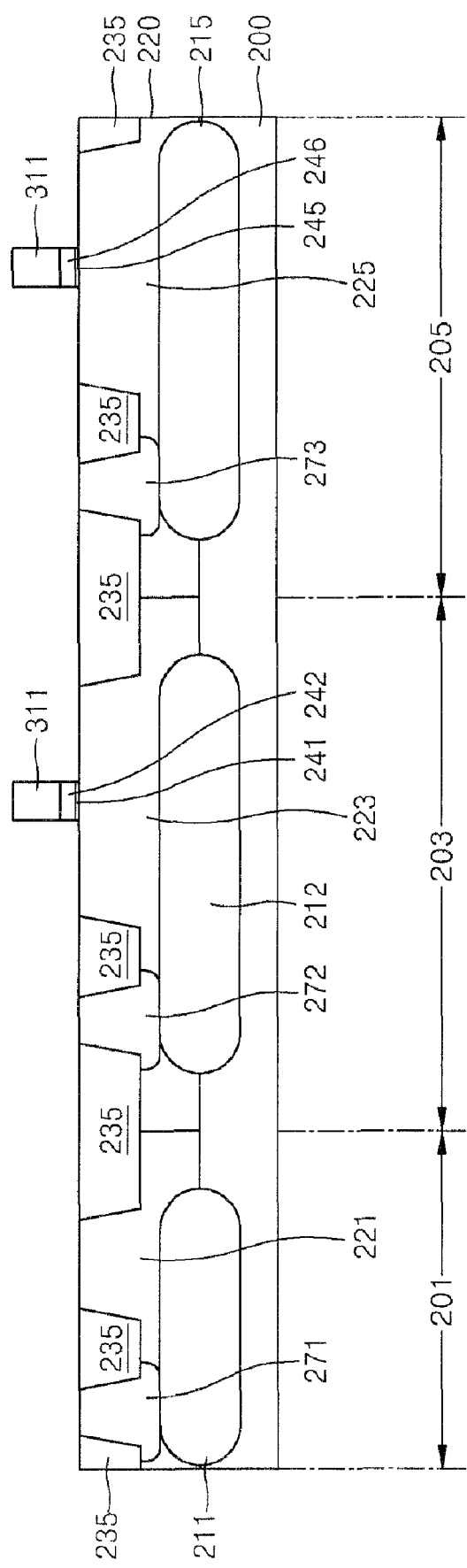

Referring to FIG. 2B, a thin first insulating layer is formed on the epitaxial layer 220, and a first photosensitive layer 311 is formed on the first insulating layer. The first insulating layer can include a thermal oxide layer or a CVD oxide layer. The first insulating layer is etched using the first photosensitive layer 311 as a mask to form a first gate insulating layer 241 for the PMOS transistor and a second gate insulating layer 245 for the NMOS transistor. After forming the first insulating layer, N type and P type impurities may be implanted respectively into the second well 223 and the third well 225 to form a channel injection region (not shown). In order to prevent the first and second gate insulating layers 241 and 245 from being contaminated by impurities in later processes, a protective layer may be further formed on the first insulating layer to protect the first and second gate insulating layers 241 and 245. The protective layer can include a conductive layer, for example, a polysilicon layer. The protective layer is etched with the first insulating layer, and thus, first and second protective layers 242 and 246 are formed respectively on the first and second gate insulating layers 241 and 245.

Figure 2C:
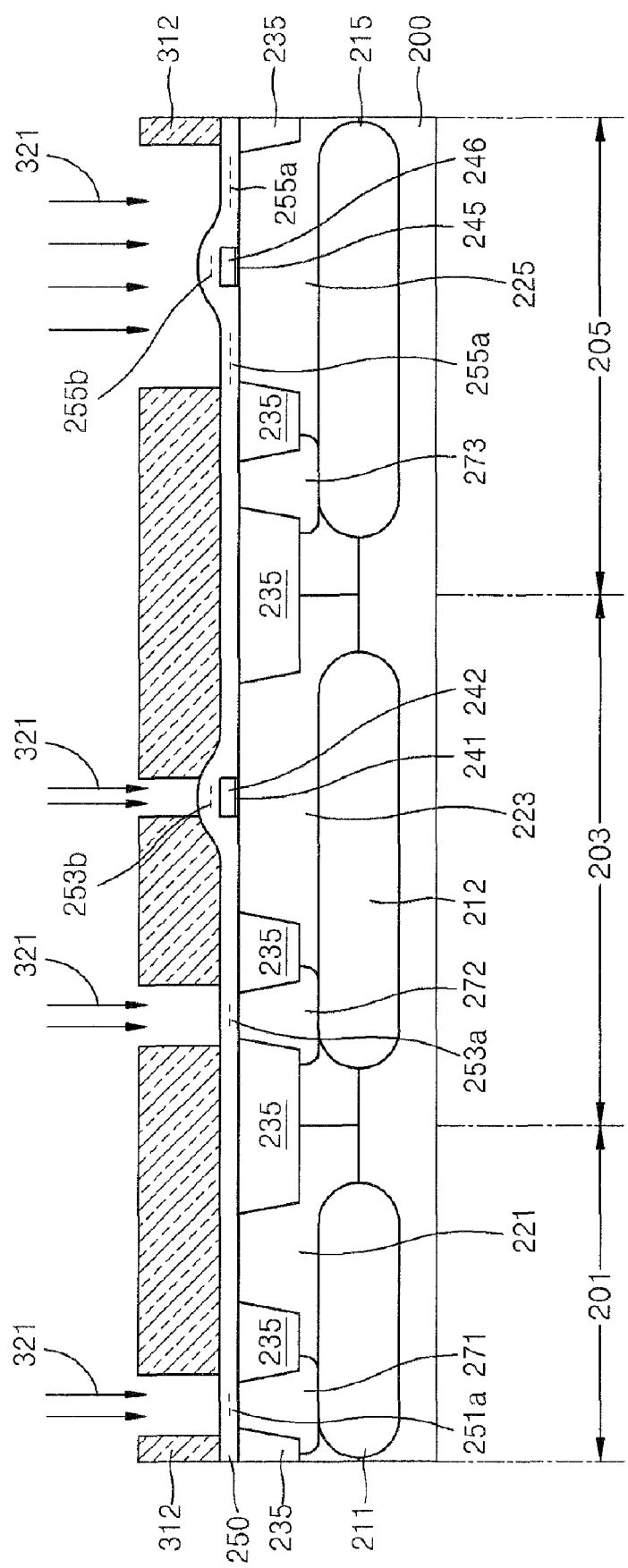

Referring to FIG. 2C, after the first photosensitive layer 311 is removed, a first polysilicon layer 250 is formed on the semiconductor substrate 200 and the first and second gate protective layers 242 and 246. Then, a second photosensitive masking layer 312 is formed on the first polysilicon layer 250 to expose the portions in which the high concentration N+ type impurity ions are to be implanted. The N+ type impurity ions 321 are then implanted in the exposed portions of the first polysilicon layer 250 using the second photosensitive layer 312 as a mask. In the first region 201, the N+ type impurity ions 321 are implanted into a first portion 251a over the first sink region 271. In the second region 203, the N+ type impurity ions 321 are implanted respectively into a first portion 253a over the second sink region 272 and into a second portion 253b over the first gate insulating layer 241. In the third region 205, the N+ type impurity ions 321 are implanted respectively into first portions 255a in both sides of the second gate insulating layer 245 and into a second portion 255b over the second gate insulating layer 245.

Referring to FIG. 2D, the second photosensitive masking layer 312 is removed. Then, a third photosensitive masking layer 313 is formed on the first polysilicon layer 250 to expose portions in which high concentration P+ type impurity ions of the first conductivity type will be implanted. The P+ type impurity ions 322 are implanted into the first polysilicon layer 250 using the third photosensitive layer 313 as a mask. In the first region 201, the P+ impurity ions 322 are implanted into second portions 251c, on which base regions will be formed. In the second region 203, the P+ impurity ions 322 are implanted into second portions 253c in both sides of the first gate insulating layer 241, and in the third region 205, the P+ impurity ions 322 are implanted into a third portion 255c over the third sink region 273.

Figure 2E:
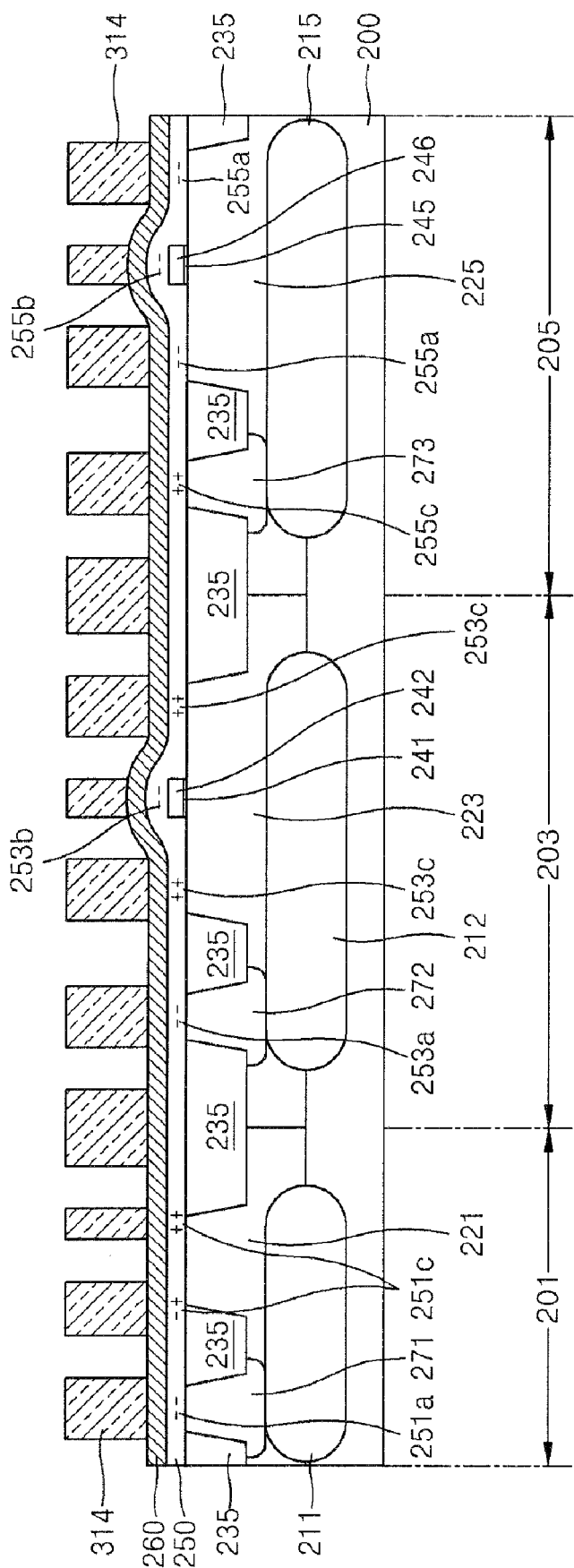

Referring to FIG. 2E, the third photosensitive masking layer 313 is removed. Then, a second insulating layer 260 is deposited on the first polysilicon layer 250. The second insulating layer 260 may include an oxide layer. A fourth photosensitive masking layer 314 is formed on the second insulating layer 260 so as to expose remaining undoped portions in the active areas below the first polysilicon layer 250 except for the first portions 251a, 253a, and 255a, and the second portions 253b and 255b, in which the N+ type impurity ions 321 are implanted, and the second portions 251c and 253c, and the third portion 255c, in which the P+ type impurity ions 322 are implanted.

Figure 2F:
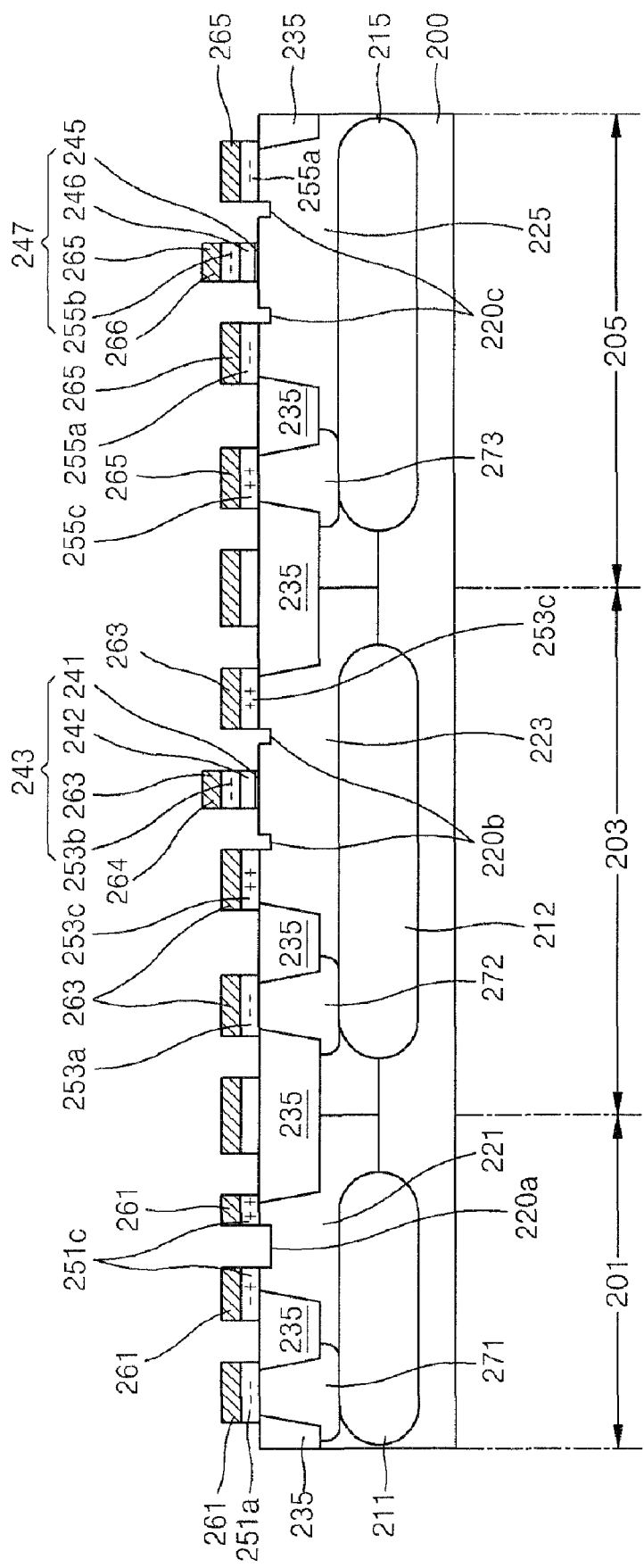

Referring to FIG. 2F, the second insulating layer 260 and the first polysilicon layer 250 are etched using the fourth photosensitive layer 314 as a mask. As a result, in the first region 201, first polysilicon patterns 251a and 251c are formed on parts of the epitaxial layer 220 which respectively correspond to the N+ type first sink region 271 and a portion where the base region is to be formed. First insulating layer patterns 261 are formed on the first polysilicon patterns 251a and 251c. In the second region 203, second polysilicon patterns 253a and 253c are respectively formed over the N+ type second sink region 272 and on both sides of the first gate insulating layer 241. Second insulating layer patterns 263 are respectively formed on the second polysilicon patterns 253a and 253c. A first gate structure 243, which includes the first gate insulating layer 241, the first protective layer pattern 242, a first gate 253b, and a first capping layer 264 which is part of the second insulating layer pattern 263, is formed between the second polysilicon patterns 253c and is spaced apart from the second polysilicon patterns 253c.

In the third region 205, third polysilicon patterns 255c and 255a remain respectively on the substrate over the P+ type third sink region 273 and on both sides of the second gate insulating layer 245. Third insulating patterns 265 are formed on the third polysilicon patterns 255a and 255c. A second gate structure 247, which includes the second gate insulating layer 245, the second protective layer pattern 246, a second gate 255b, and a second capping layer 266, which is part of the third insulating pattern 265, is disposed between the third polysilicon patterns 255a and is spaced apart from the third polysilicon patterns 255a. Then, the fourth photosensitive layer 314 is removed. The distance between the first gate structure 243 and the second polysilicon pattern 253c in the second region 203 and the distance between the second gate structure 247 and the third polysilicon pattern 255a in the third region 205 may be adjusted during a patterning of the first polysilicon layer 250 to control the breakdown voltages of the respective devices.

When the first polysilicon layer 250 is etched, portions of the first through third wells 221, 223, and 225 in the first through third regions 201, 203, and 205, respectively, are etched. Thus, a portion of the first well 221, which is between the first polysilicon patterns 251c in the first region 201, is etched to form a first trench 220a. In the second region 203, portions of the second well 223, which are between each of the second polysilicon patterns 253c and the first gate structure 243, are etched to form second trenches 220b. In the third region 205, portions of the third well which are between each of the third polysilicon patterns 255a and the second gate structure 247, are etched to form third trenches 220c.

Figure 2G:
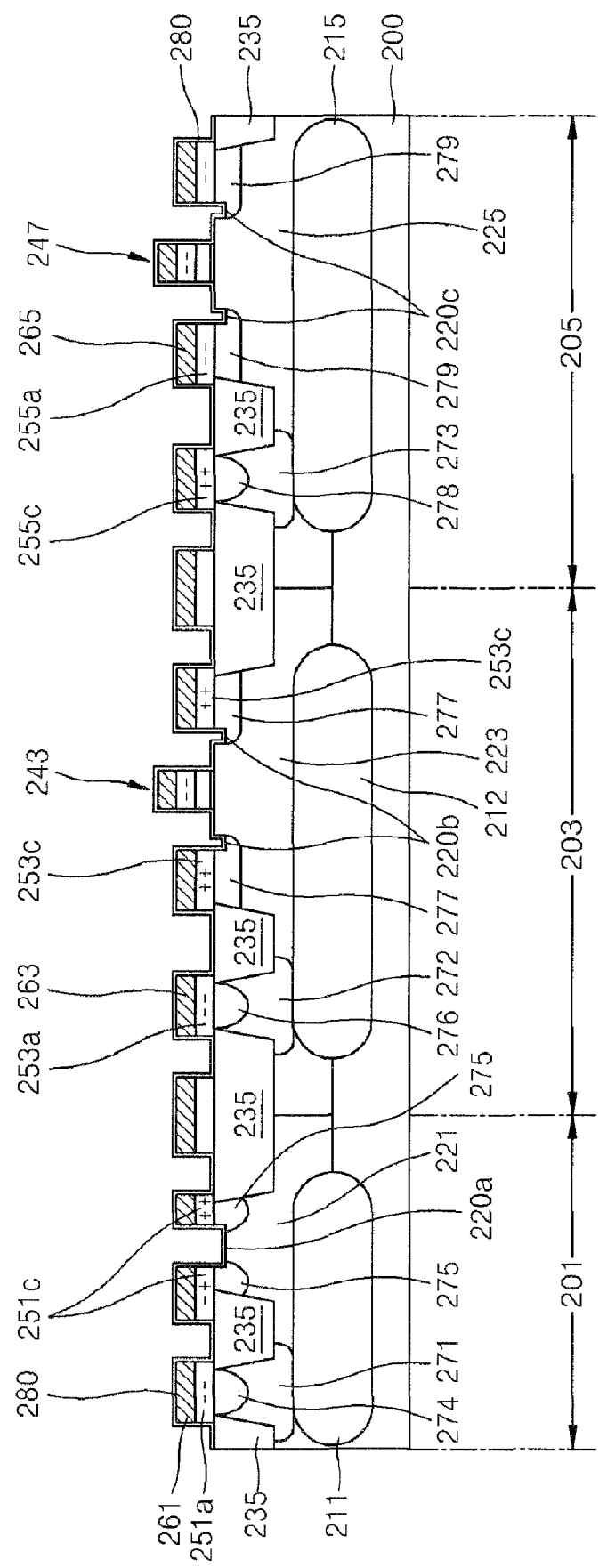

Referring to FIG. 2G, a thin third insulating layer 280 is formed on the entire top surface of the structure shown in FIG. 2F and a diffusion process is performed. In the first region 201, an N+ type diffusion region 274 which is a collector region of the NPN transistor is formed in the first sink region 271, and P type base junction regions 275 are formed in the first well 221. In the second region 203, an N+ type first diffusion region 276 is formed in the second sink region 272, and high concentration P+ type first source/drain regions 277, which contact the side surfaces farthest from the first gate structure 243 and bottom surfaces of the second trenches 220b, are formed in the second well 223. In the third region 205, a P+ type second diffusion region 278 is formed in the third sink region 273, and high concentration N+ type second source/drain regions 279, which contact the side surfaces farthest from the second gate structure 247 and bottom surfaces of the third trenches 220c, are formed in the third well 225 and on both sides of the second gate structure 247.

Figure 2H:
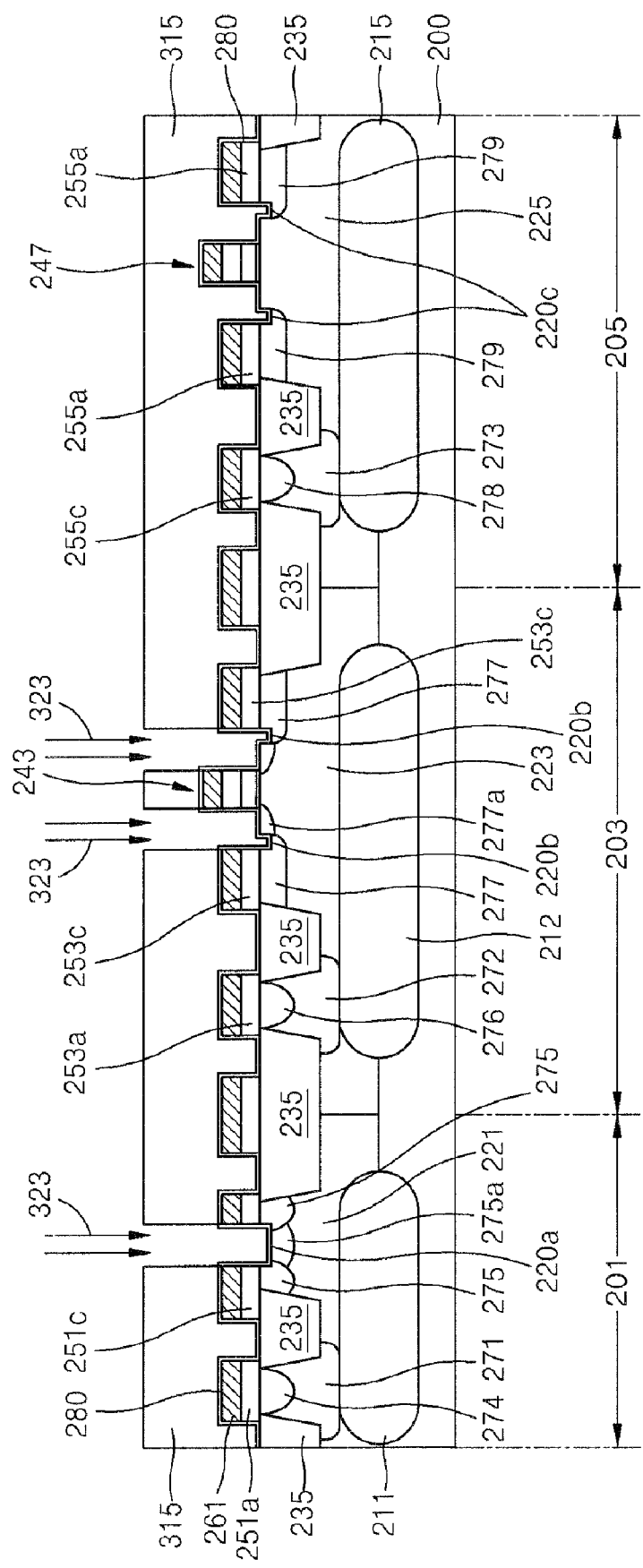

Referring to FIG. 2H, a fifth photosensitive layer 315 is formed on the third insulating layer 280 to expose a portion of the third insulating layer 280 in the first trench 220a between the P type base junction regions 275 of the first region 201 and portions of the third insulating layers 280 between the high concentration P+ type second source/drain regions 277 and the first gate structure 243 of the second region. Then, P− type impurity ions 323 that are low concentration impurity ions of a first conductivity type are implanted the first well 221 and the second well 223 using the fifth photosensitive layer 315 as a mask. As a result, a base connection region 275a that is arranged between the P type base junction regions 275 for connecting the P type base junction regions 275 to each other, is formed in the first well 221. Therefore, a base region of the NPN transistor, which includes the P type base junction regions 275 and the base connection region 275a, is formed. The base connection region 275a formed below the bottom surface of the first trench 220a in the base connection region 275a has a junction depth that is shallower than the base junction regions 275.

Low concentration P-type first source/drain regions 277a that contact the high concentration P+ type first source/drain regions 277 are formed in the second well 223 between the high concentration P+ type first source/drain regions 277 and the first gate structure 243. When the diffusion process is performed to form the low concentration P-type first source/drain regions 277a, a thermal oxide layer (not shown) may be formed on the third insulating layer 280.

Figure 2I:
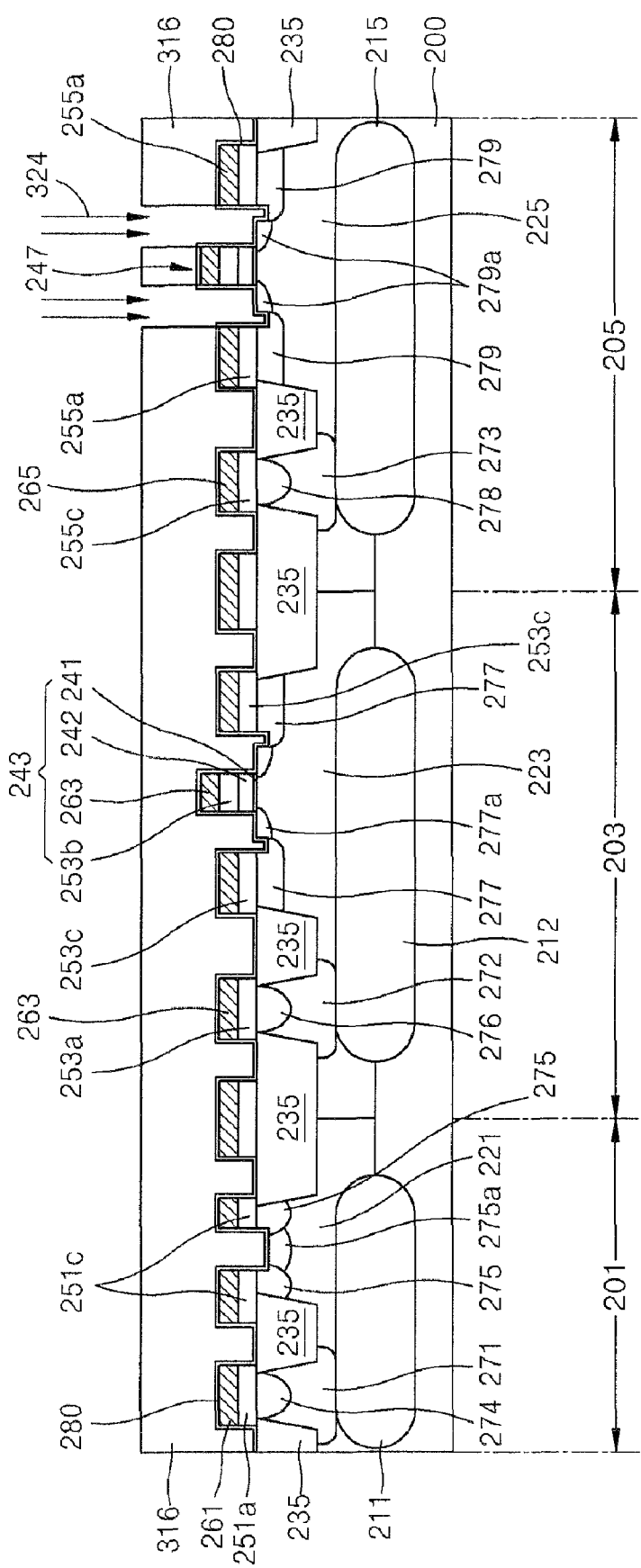

Referring to FIG. 2I, the fifth photosensitive layer 315 is removed. Then, a sixth photosensitive layer 316 is formed on the third insulating layer 280 to expose portions of the third insulating layer 280 between the high concentration N+ type second source/drain regions 279 and the second gate structure 247 in the third region 205. N-type impurity ions 324 that are low concentration impurity ions of a second conductivity type are implanted into the third well 225 using the sixth photosensitive layer 316 as a mask. Low concentration N type second source/drain regions 279a that contact the high concentration N+ type second source/drain regions 279 are formed in the third well 225 between the high concentration second source/drain regions 279 and the second gate structure 247. When a diffusion process is performed for forming the low concentration N type second source/drain regions 279a, a thermal oxide layer (not shown) may be formed on the third insulating layer 280.

Figure 2J:
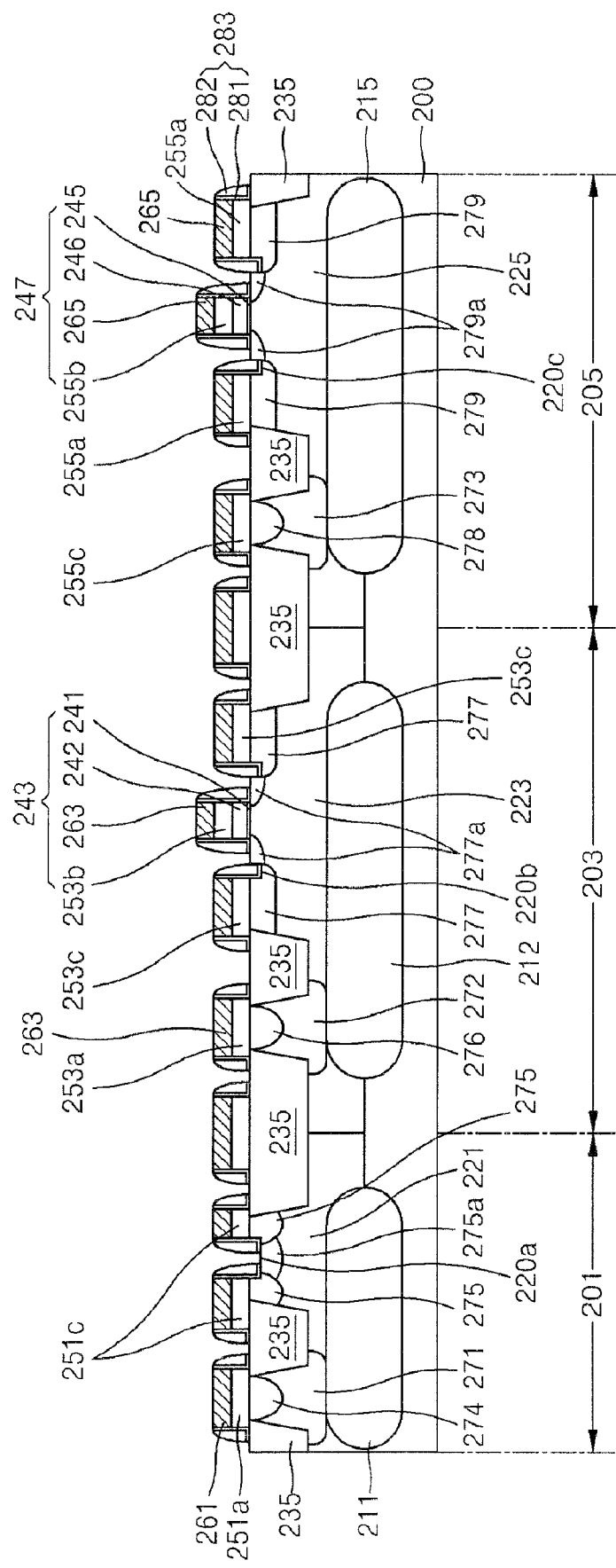

Referring to FIG. 2J, the sixth photoresist layer 316 is removed and a fourth insulating layer, for example, a nitride layer, is deposited on the third insulating layer 280, and an etch-back process is performed to form spacers 283 on both walls of the first and second gate structures 243 and 247. The spacers 283 each include portions 281 of the third insulating layer 280 and portions 282 of the fourth insulating layer after the etch-back process. The spacers 283 are also formed on both walls of the first polysilicon patterns 251a and 251c, the second polysilicon patterns 253a and 253c, and the third polysilicon patterns 255a and 255c and the first, second, and third insulating layer patterns 261, 263, and 265 of the respective first through third regions 201, 203, and 205. The spacers 283 that are formed on both walls of the first, second, and third polysilicon patterns 251c, 253c, and 255a are also formed on inner side surfaces of the trenches 220a, 220b, and 220c. During the etch-back process for forming the spacers 283, the base connection region 275a is exposed, and the low concentration first and second source/drain regions 277a and 279a are exposed.

Figure 2K:
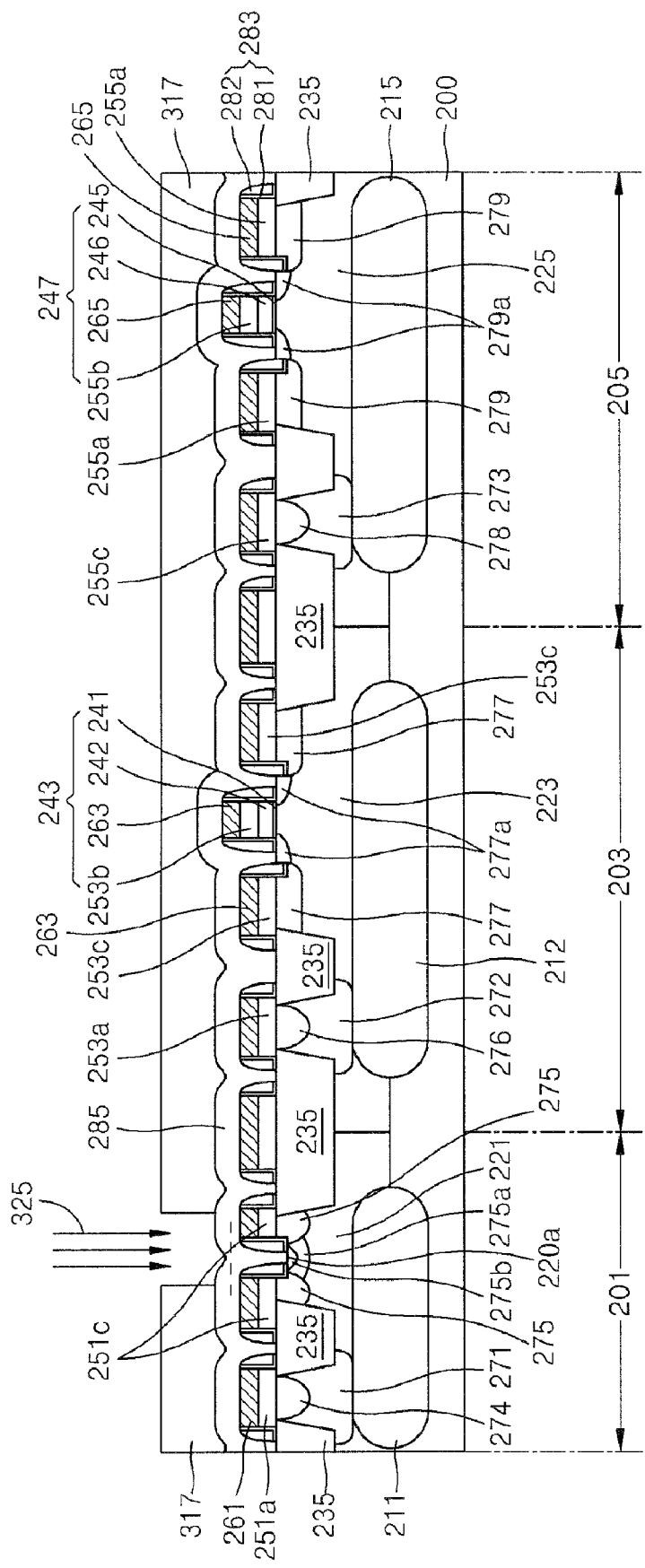

Referring to FIG. 2K, a second polysilicon layer 285 is formed on the entire top surface of the structure shown in FIG. 2J including the exposed base connection region 275a and the exposed low concentration first and second source/drain regions 277a and 279a. A seventh photosensitive layer 317 is formed on the second polysilicon layer 285 to expose a portion of the second polysilicon layer 285, which includes the exposed base connection region 275a. N+ type high concentration impurity ions 325 of a second conductivity type are implanted into the exposed portion of the second polysilicon layer 285 using the seventh photosensitive layer 317 as a mask. A diffusion process is performed after implanting the ions 325, to form an N+ type emitter region 275b that is surrounded by the base connection region 275a below the bottom surface of the first trench 220a. An oxide layer (not shown) may be deposited on the second polysilicon layer 285 after implanting the ions 325, and then the oxide layer may be removed after performing the diffusion process.

Figure 2L:
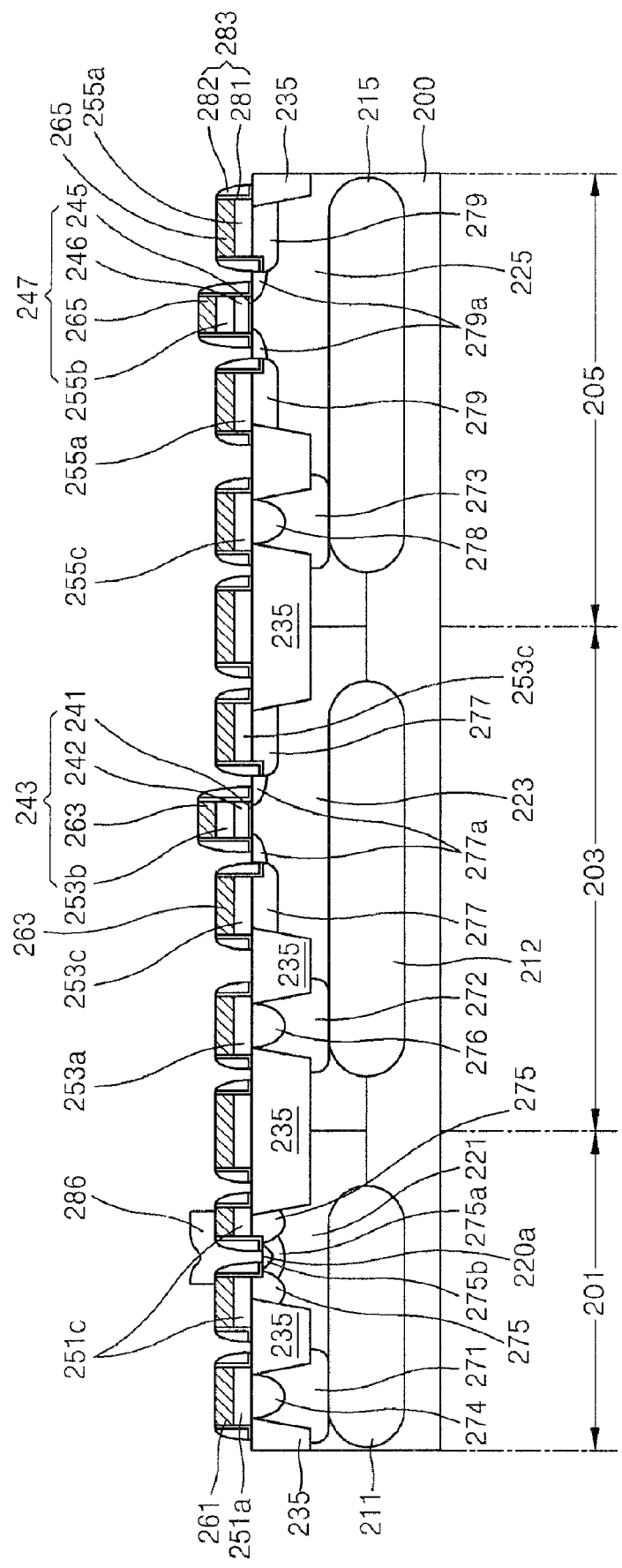

Referring to FIG. 2L, the seventh photosensitive layer 317 is removed. An eighth photosensitive layer (not shown) is formed on the second polysilicon layer 285 to expose the second polysilicon layer 285 except for a portion above the emitter region 275b. The exposed portion of the second polysilicon layer 285 is etched using the eighth photosensitive layer as an etching mask to form a fourth polysilicon pattern 286. A metal silicide layer (not shown) may be further formed on the fourth polysilicon pattern 286.

Figure 2M:
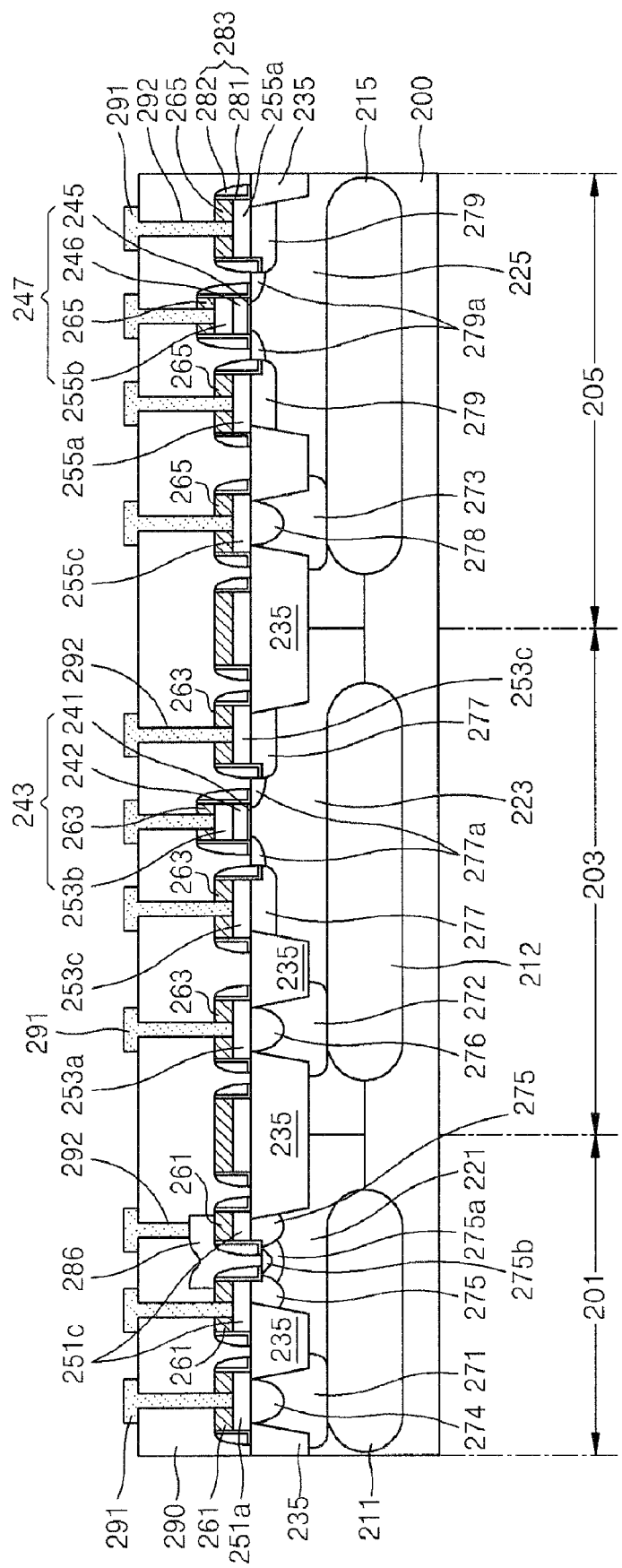

Referring to FIG. 2M, the eighth photosensitive layer is removed. A fourth insulating layer 290 is formed on the entire top surface of the structure shown in FIG. 2L to function as an interlayer dielectric layer. Then, the fourth insulating layer 290 and the first, second, and third insulating layer patterns 261, 263, and 265, except for the section of the first insulator pattern 261 which has its center under the fourth polysilicon pattern 286, are etched to form contact holes 292, which expose the first polysilicon patterns 251a and 251c, the second polysilicon patterns 253a and 253c, the third polysilicon patterns 255a and 255c, and the first and second gates 253b and 255b. Metal contacts 291 are formed in the contact holes 292 to connect to the first polysilicon patterns 251a and 251c, the second polysilicon patterns 253a and 253c, the third polysilicon patterns 255a and 255c, and the first and second gates 253b and 255b, which are exposed through the contact holes 292.

Figure 3A:
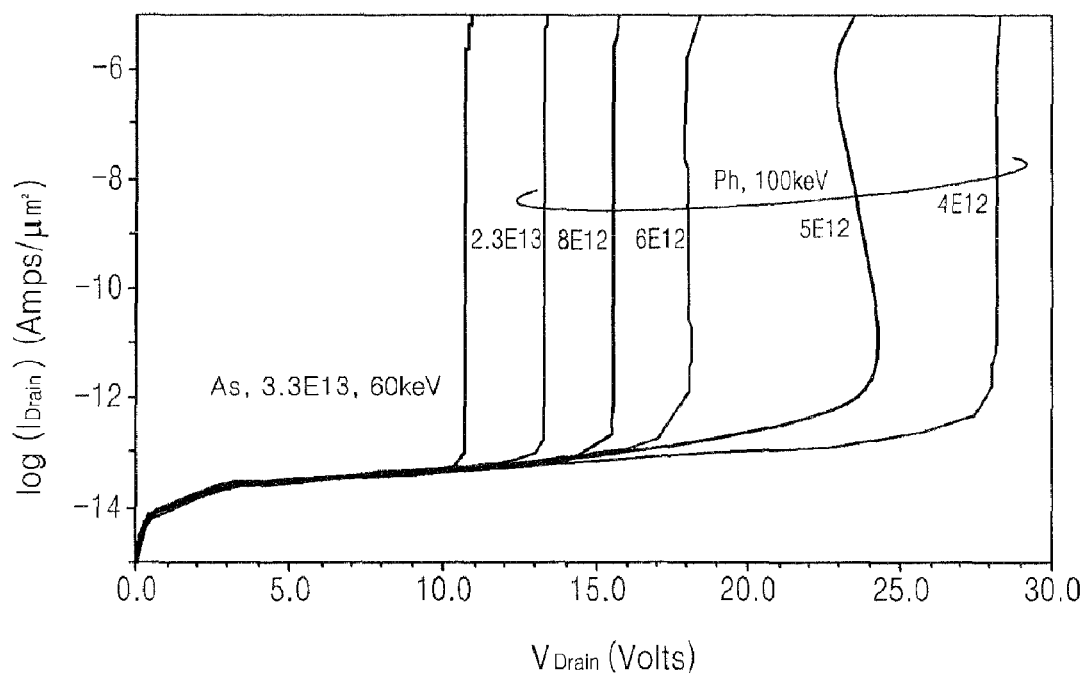
FIGS. 3A and 3B are graphs showing a voltage-current characteristic of a N-channel MOS (NMOS) transistor and a P-channel MOS (PMOS) transistor according to an embodiment of the present invention, respectively.
Figure 3B:
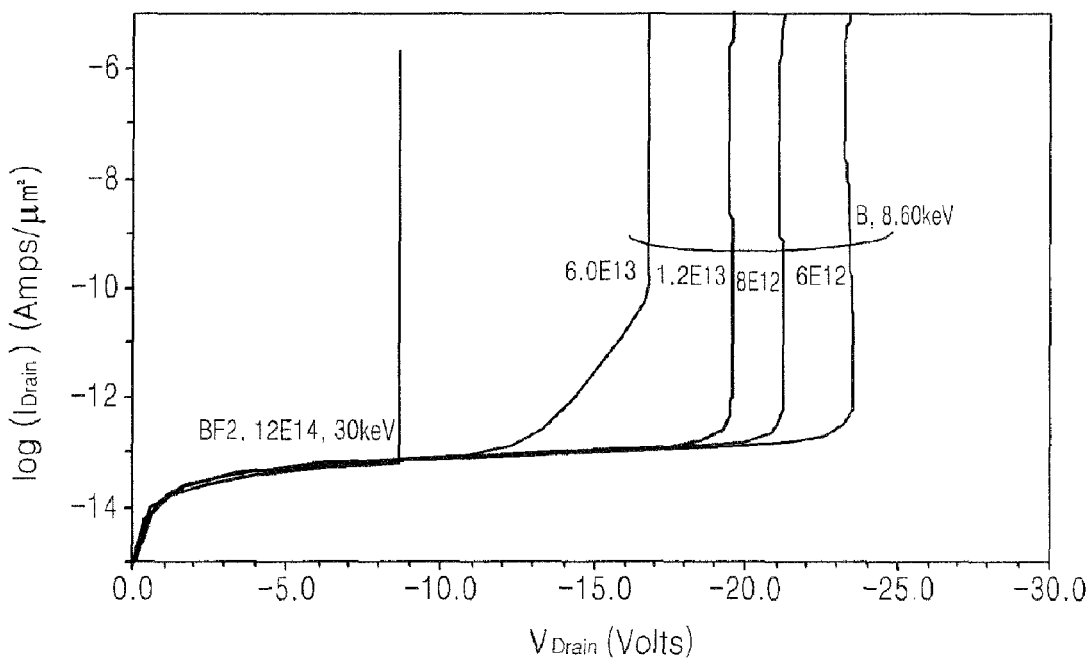

FIGS. 3A and 3B are graphs showing reverse bias current-voltage characteristics of the NMOS transistor and the PMOS transistor, respectively, in the Bi-CMOS transistor according to the embodiment of the present invention. As shown in FIGS. 3A and 3B, the breakdown voltages of the transistors can be varied by changing the implantation dose of the impurity, for example, phosphorus (Ph), in the low concentration source/drain regions of the NMOS transistor, and changing the implantation dose of the impurity, for example, boron (B), in the low concentration source/drain regions of the PMOS transistor.

According to a semiconductor device and a method of fabricating the semiconductor device of the present invention, a source/drain and a gate can be formed using a doped polysilicon process, and thus, fabrication processes can be simplified. In addition, an extended lightly-doped-drain (LDD) drain structure can be formed by etching some parts of an epitaxial layer, and thus, the breakdown voltage can be improved and a high-voltage CMOS transistor can be fabricated. In addition, since trenches are formed by etching some parts of the substrate or the epitaxial layer, a junction depth of a base region can be reduced, and thus, a base resistance can be reduced. Moreover, according to the present invention, the breakdown voltage can be improved by controlling the distances between polysilicon patterns for forming the gate and the source/drain regions or by controlling the dose amount of ions implanted into the low concentration source/drain regions.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of fabricating a semiconductor device using a doped polysilicon process, the method comprising:
    forming a first insulating layer on a portion of an active region of a first conductivity type epitaxial layer;
    forming a conductive layer on the epitaxial layer and the first insulating layer;
    implanting high concentration impurities of a second conductivity type into a first portion of the conductive layer over the first insulating layer and second portions of the conductive layer, which are disposed in both sides of the first insulating layer, and implanting high concentration impurities of the first conductivity type into a third portion of the conductive layer, which is spaced from one of the second portions;
    forming a gate structure, which comprises the first insulating layer and a gate including the first portion disposed on the first insulating layer, by patterning the conductive layer, and forming first conductive layer patterns that are spaced from the gate structure and including the second portions in both sides of the gate structure, and a second conductive layer pattern including the third portion, which is spaced from one of the first conductive layer patterns, on the epitaxial layer;
    forming a second insulating layer on the epitaxial layer including the gate structure and the first and second conductive layer patterns, forming high concentration first impurity regions of the second conductivity type spaced from the gate structure on the epitaxial layer, below the first conductive layer patterns, and forming a high concentration second impurity region of the first conductivity type on the epitaxial layer, below the second conductive layer pattern; and
    forming low concentration third impurity regions of the second conductivity type by implanting low-concentration impurities of the second conductivity type into the epitaxial layer between the gate structure and the highly concentrated first impurity regions.

2. The method of claim 1, wherein the first insulating layer comprises a gate insulating layer, and the method further comprises:
    forming a protective layer on the first insulating layer after forming the first insulating layer and before forming the conductive layer.

3. The method of claim 2, wherein the protective layer comprises a polysilicon layer.

4. The method of claim 2, further comprising:
    forming a third insulating layer on the conductive layer,
    wherein the third insulating layer is patterned with the conductive layer to form a capping layer on the gate, and insulating layer patterns are disposed on the first and second conductive layer patterns.

5. The method of claim 4, further comprising:
    forming trenches by etching portions of the epitaxial layer, which contact side surfaces of the first conductive patterns facing the gate structure,
    wherein the high concentration first impurity regions are formed to respectively contact bottom surfaces and side surfaces of the trenches.

6. The method of claim 1, before forming the first insulating layer, the method further comprising:

forming a high concentration buried region of the second conductivity type, which contacts the second impurity region, in the epitaxial layer;

forming a well in which the first through third impurity regions are formed, by implanting low-concentration impurities of the first conductivity type into the epitaxial layer; and forming device isolation layers in the wells so as to define the active region in which the first through third impurity regions are formed, wherein the second impurity region is separated from the first impurity regions by the device isolation layers.

7. The method of claim 6, further comprising:

forming a sink region including the high concentration second impurity region, by implanting high concentration impurities of the first conductivity type into the well, in which the highly concentrated second impurity region is formed, wherein the sink region is separated from one of the first impurity regions by one of the device isolation layers and contacts the high concentration buried region.

8. The method of claim 1, after forming the low concentration third impurity regions, further comprising:

forming an insulating layer for a spacer on the second insulating layer;

forming spacers on side walls of the gate structure by etching the second insulating layer and the insulating layer, and forming spacers on side walls of the first and second conductive layer patterns;

forming an interlayer dielectric layer on the epitaxial layer on which the gate structure and the first and second conductive layer patterns are formed;

forming contact holes, which expose portions of the first and second conductive layer patterns and a portion of the gate, by etching the interlayer dielectric layer; and forming wires in the contact holes to connect to the first and second conductive layer patterns and to the gate.

* * * * *